United States Patent [19]

Klink et al.

[11] Patent Number: 4,598,459
[45] Date of Patent: Jul. 8, 1986

[54] INSTALLATION FOR MANUAL ASSEMBLYING OF COMPONENTS ON A PRINTED CIRCUIT BOARD

[75] Inventors: Gerhard Klink, Garching; Dietmar Kraske, Munich; Egon Edinger, Graefelfing; Joachim Koetter, Munich; Klaus Krumrey, Speyer; Jörg Mayser, Bruchsal; Ulrich Michael, Stockdorf, all of Fed. Rep. of Germany

[73] Assignee: Siemens Aktiengesellschaft, Berlin & Munich, Fed. Rep. of Germany

[21] Appl. No.: 714,509

[22] Filed: Mar. 21, 1985

[30] Foreign Application Priority Data

Mar. 22, 1984 [DE] Fed. Rep. of Germany ....... 3410574

[51] Int. Cl.⁴ .................... B23P 19/04; H05K 3/30
[52] U.S. Cl. .................................. 29/564.8; 29/407; 29/703; 29/712; 29/721; 29/741; 29/836; 364/468
[58] Field of Search .............. 29/564.8, 33.4, 566.3, 29/564.1, 564.2, 709, 711, 712, 720, 721, 739, 740, 741, 742, 748, 759, 760, 829, 831, 832, 833, 834, 835, 836, 837, 838, 844, 845, 407, 703; 364/468, 491; 318/572

[56] References Cited

U.S. PATENT DOCUMENTS

| | | | |
|---|---|---|---|
| 3,986,244 | 10/1976 | Latanzi | 29/739 X |
| 4,027,246 | 5/1977 | Caccoma et al. | 364/468 |
| 4,092,719 | 5/1978 | Salmon | 29/711 X |
| 4,123,695 | 10/1978 | Hale et al. | 318/572 X |
| 4,190,890 | 2/1980 | Marx | 29/720 X |
| 4,283,847 | 8/1981 | May | 29/832 |
| 4,383,359 | 5/1983 | Suzuki et al. | 29/759 X |
| 4,473,883 | 9/1984 | Yoshida et al. | 364/468 X |
| 4,511,421 | 4/1985 | Kuehn et al. | 29/739 X |

Primary Examiner—Gil Weidenfeld
Assistant Examiner—Glenn L. Webb
Attorney, Agent, or Firm—Hill, Van Santen, Steadman & Simpson

[57] ABSTRACT

An installation for manually assemblying electrical and electronic components on a printed circuit board using a display device for optically identifying the respective assembly positions of the component on the board, at least one magazine with a removable position for supplying the required component and an arithmetic unit for controlling the display device and selection of the particular magazine characterized by the magazine being designed to carry all components for a large number of different printed circuit boards and an identification device which is connected to the arithmetic unit to identify the particular circuit board which is being supplied, sending a signal to the arithmetic unit to identify the board so that the arithmetic unit provides the necessary assembly program. With this improved installation, different printed circuit boards having different requirements for assembly positions and components can be assembled one after another without requiring costly delays to select new programs and supply new components.

20 Claims, 6 Drawing Figures

INSTALLATION FOR MANUAL ASSEMBLYING OF COMPONENTS ON A PRINTED CIRCUIT BOARD

BACKGROUND OF THE INVENTION

The present invention is directed to an installation for manual assembling of components on a printed circuit board to form a PC or printed circuit module. The installation includes a holding means for the non-mistakable positioning of a printed circuit board on which the components are to be assembled, display means or device for the optical identification of the respective assembly positions of each component on the printed circuit board held in the holding means, at least one magazine for the purpose of making available a component required for each assembly and an arithmetic unit or means for controlling the display device and the removal positions of the components in the magazine corresponding to the specific assembly program.

An installation of this type for the manual assembly of a printed circuit board which is also a briefly designated practice as a manual assembly station is known, for example, from a firm publication "IDAS 402", 9/83 of G. E. Schlup & Co., P. 0. B. 26 CH-2543 Lengnau. In the case of this known manual assembly station, the printed circuit boards, which are to have components assembled thereon are positioned in a holding device which is arranged in a surface of a work table which is positioned at an angle in the fashion of a desk. In addition, on the work table, there are two tower-shaped magazines with compartments arranged in sector formation in several planes to receive the various components required for assembly operations that are to be made. Each of these tower-shaped magazines is capable of being rotated on its axis and also being moved along its axis to present the particular compartment desired at a given position. A display device serves the purpose of optical identification of the respective insertion positions of the particular component on a printed circuit board positioned in the holding device or means so that the optical display or identification, respectively, is projected directly into the bores of the printed circuit board. On a separate stand adjacent the work table, an arithmetic or computer with the display screen and a program keyboard is arranged.

If the printed circuit boards, which are combined into a lot, are to be equipped, first a quantity tailored to the lot size of the components required for the assembly is prepared for the assembling and sorted into the individual compartments of the two magazines. Subsequently, via a program keyboard, an equipping or assembly program associated with the particular circuit board is input into the arithmetic unit or means so that the display screen renders possible a continuous control of the input data. The data input in this fashion defines the light points of the respective assembly positions of each component and the sequence of the presentation or positioning of compartments of the two magazines corresponds to the assembly operation sequence. In the case of the following assembly, the arithmetic unit then controls the display device and the magazines in such a fashion that the respective assembly positions are identified on the printed circuit boards and the desired compartments of the magazines are positioned to provide the corresponding component.

The known manual assembly station is, in particular, suited for the assembly of a plurality of similar components on a similar printed circuit board which are to be combined into one lot. In the case of a lot change, a conversion of the manual equipping station with a sorting of the now-required and correspondingly prepared components into the two magazines and with the input of a new assembly program into an arithmetic unit is necessary.

SUMMARY OF THE INVENTION

The object of the present invention is to provide an installation for the manual assembly of components on a printed circuit board in which, without conversion or changeover and without being tied to a specific lot size, various types of printed circuit boards can have corresponding components assembled thereon in immediate succession to each other.

This object is achieved as an improvement of an installation for the manual assembly of electric and/or electronic components on a printed circuit board comprising a table with holding means for the non-mistakable positioning of a printed circuit board on which the components are to be assembled, a display device for the optical identification of the respective assembly positions of the components on the printed circuit board held in the receiver, at least one magazine for the purpose of making available the components required for each assembly operation and an arithmetic unit or means for controlling the display device and the removable positions of the components in each of the magazines corresponding to the specific assembly program. The improvements are each magazine being designed for making available all components which are required for a spectrum of PC modules to be produced, the arithmetic means having access to all assembly programs of all of the PC modules of the spectrum of PC modules to be produced and identification means connected to the arithmetic unit for identifying a printed circuit board being presented and for activating the associated assembly programs for the identified printed circuit board.

Thus, in the case of the inventive installation, all components, which are required for a spectrum of printed circuit boards to be manufactured, are put in readiness in the magazine or possibly two or more magazines. It should be understood that the term "spectrum of printed circuit boards" means a plurality of different types of printed circuit boards which, in dependence upon the abundance of variation present, can comprise all types to be manufactured or the types of one product family or the types of one product.

A conversion or changeover cost through the input of respectively necessary assembly programs is avoided in the case of the installation of the present invention because the arithmetic unit or means or computer has access to all assembly programs of the printed circuit board spectrum to be manufactured. This access is, for example, rendered possible in that all assembly programs are stored in the arithmetic unit or that the arithmetic unit retrieves the individual assembly programs from a higher ranking or order computer. The assembly programs can, however, also be contained in the program cassette which can be automatically dialed by a corresponding alternate device and which can be automatically placed into the arithmetic unit. Finally, a significant constituent part of the installation of the present invention is formed by an identification device which identifies the particular printed circuit board which is being supplied and automatically activates the associated assembly program in the arithmetic unit.

The advantages achieved with the invention are that the cost for order or type-related assemblying is dispensed with entirely and the components need only be sorted into the magazine or magazines in a consumption-related fashion. An entirely new operating cycle concept results in which no combination into lots is necessary and the fabrication can be tailored to actual requirements with a considerable reduction of storage and/or inventory costs. Thus, for example, rush orders can be incorporated into a running production without special treatment. Other advantages will become apparent when reviewing the drawings and specification.

DESCRIPTION OF THE PREFERRED EMBODIMENTS

Figure 1:
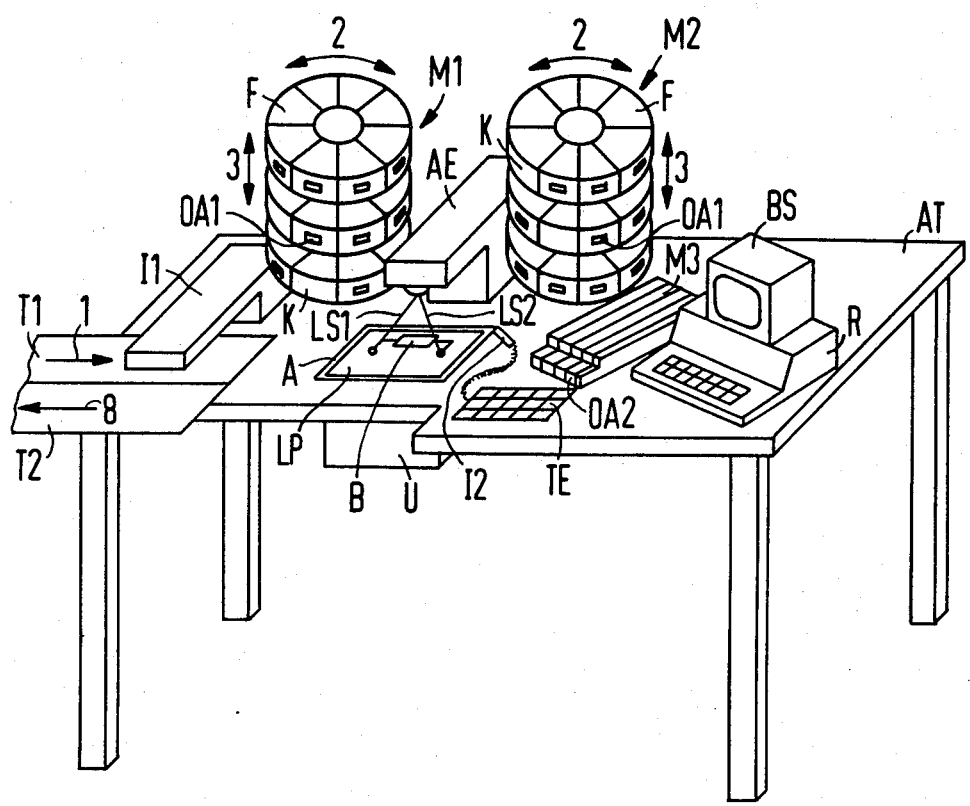
FIG. 1 is a schematic presentation of a manual assembly station or installation for assembling electrical and/or electronic components on a printed circuit board in accordance with the present invention.

The principles of the present invention are particularly useful when incorporated into an installation for the manual assembly of electric and/or electronic components in a printed circuit board which is schematically illustrated in FIG. 1. The installation includes a work table AT which has a work surface. On the work surface of the table AT, the installation has a stationary identification device or means I1, two tower-shaped magazines M1 and M2, a display device or means AE, a receiver or holding means A for the positioning of the printed circuit board LP; an identification device I2, which is designed in the form of a hand-held reading device; a keyboard unit TE; several bar magazines M3 and an arithmetic unit or computer R which associated display screen BS. On the left side of the work table AT there can be recognized a first transport device T1 for supplying of a printed circuit board LP, which is to be provided with the components B and a second transport device T2 for the removal-transport of the printed circuit board LP or printed circuit module, respectively, which has had the assembly operations completed. In addition, on the underside of the work surface of the work table AT, a subtool or lower tool means U can be provided, which is illustrated in FIG. 1 as a box. Also, it should be noted that each of the two tower-shaped magazines M1 and M2 have compartments F, which are arranged in sector formation in three planes, respectively, and each of these magazines can be rotated on their axes and shifted along their axes to present an individual compartment at a given position or location.

In the case of a manual assembly station or installation illustrated in FIG. 1, a printed circuit board LP, which is to have components assembled thereon, are transported via the transport device T1 which, for example, can be in the form of a conveyor belt and moves in the direction of arrow 1, beneath an identification device I1 to the work surface of the table AT. The identification device or means I1 with the aid of a laser scanner scans codings such as a bar code, applied on the printed circuit board LP for the purpose of identification of the particular type. The means I1 will detect the rays reflected by the coding via receiving optics and interpret them with the aid of a corresponding logic unit. After the identification of the type of the particular circuit board being supplied, the identification device I1 then supplies to the arithmetic unit R a corresponding identification signal. On the basis of this identification signal, the desired assembly program which is associated with the identified printed circuit board LP is selected from the number of assembly programs stored in the unit R and this selected program is then activated. The operating individual or assembler at the manual assembly station then inserts the identified printed circuit board LP in the holding means or holder A which is designed in the form of a fixation frame in the illustrated sample embodiment. The holding means A is so designed that the printed circuit board LP can be positioned non-mistakably which, for example, can be achieved through advance and return in the receiver A and the printed circuit board LP or through positioning pins associated with holes in the printed circuit board LP. The arithmetic means activates the lifting and rotating arrangement for each of the magazines M1 and M2 and also any rod magazine M3, which are capable of being lowered into the work surface in response to the selected assembly program in such a fashion that the particular compartment F or the particular rod magazine M3, respectively, which contains the component P required for the respective assembly operation is presented and the optical displays OA1 or OA2, respectively, light up. These optical displays OA1 and OA2 relate, for example, to LED displays. In the case of the magazines M1 and M2, the arithmetic unit R simultaneously effects such a rotation in the direction of the double arrow 2 and such a height adjustment in the direction of the double arrow 3 that the operating individual can remove the selected component B from the front and at a small height from the work surface. For the purpose of additional security through a corresponding control of the arithmetic unit R, only the frontal flaps K of those compartments F can be opened which contain the component B required for the particular assembly operation. The component B, removed from the magazine such as M1 or M2 or the rod magazine M3, are then inserted in a component preparation device which is not illustrated in FIG. 1.

Figure 5:
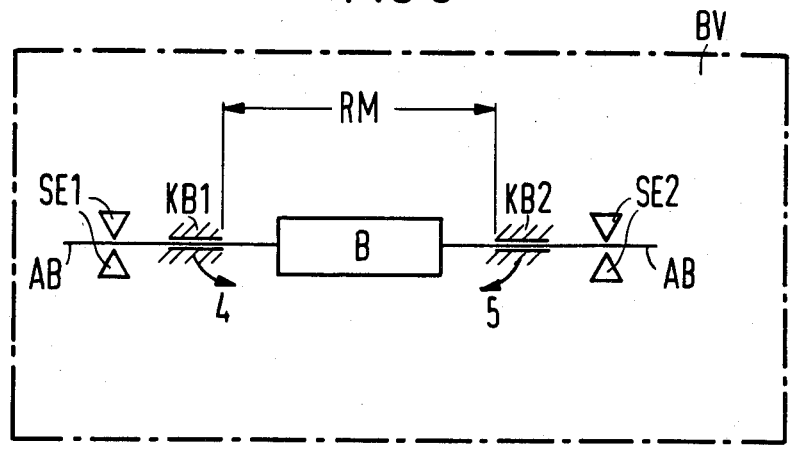
FIG. 5 is a schematic illustration illustrating a component preparation means.
Figure 6:
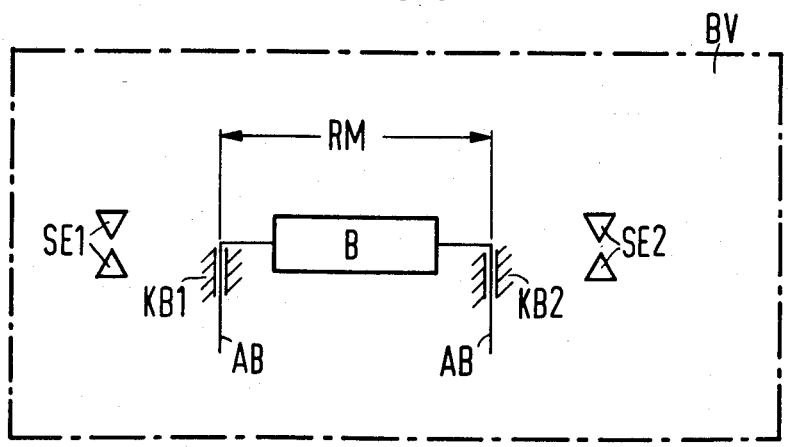
FIG. 6 is an illustration similar to FIG. 5 after completion of the preparation of the component.

The operating principles of such a component preparation device BV which are provided on the work table AT are illustrated schematically in FIGS. 5 and 6. It can be recognized therein that the component B is inserted in such a fashion that their connecting legs or leads AB are seized and clamped by two clamping jaw pairs KB1 and KB2. The clamping jaw pairs KB1 and KB2 can be adjusted from each other a distance corresponding to the respective assembly program via the signal from the arithmetic unit R to a correct grid or spacing dimension RM and can be rotated in the direction of arrows 4 and 5, respectively, through 90°. In addition, the component preparation device BV also includes two cutting devices SE1 and SE2, which are controlled by the arithmetic unit R and which cutting devices cut off or trim the connecting legs or leads AB of the component B to the desired length. As illustrated in FIG. 6, the component preparation device BV has the clamping jaw pairs KB1 and KB2 rotated through 90°. In this position, the legs AB have already been cut to the desired length and are now bent in such a fashion that they can be readily inserted into the holes at the desired assembly position in the associated printed circuit board LP.

After the previously described preparation of a component B which has been removed from a particular magazine, the component B is inserted by the assembler into the printed circuit board LB to be equipped at the provided assembly positions. The assembly positions are optically identified (FIG. 1) by the display device AE which is controlled by the arithmetic unit R and project light rays LS1 and LS2 at the corresponding bores or holes of the printed circuit board LP. This optical identification can also be conducted from below and can possibly contain information regarding the polarity of the component B. In the illustrated embodiment, the light rays LS1 and LS2 are directed from above via deflecting optics onto the printed circuit board LP. The control of these deflecting optics is done by a microprocessor of the display AE and the microprocessor is controlled by the central information of the respective activated assembly program which is provided by the arithmetic unit R. After the insertion in the printed circuit board LP, the connecting or connection legs AB of the component B, which legs protrude through the board, are bent by a tool means U which are controlled by the arithmetic unit R in accordance with the particular selected assembly program. The bending of the legs of the component B insures the component against falling out during a later transport of the printed circuit boards. In other words, the bending provides a temporary securing of the component in the printed circuit board. If the connecting legs of the component B have not been cut to the desired length in the component preparation device BV, cutting the length can also be carried out by the lower tool means U.

Figure 2:
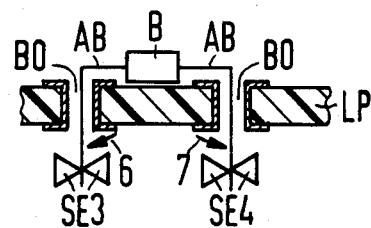
FIG. 2 is a partial cross-sectional view schematically illustrating a first step of an assembly tool for temporarily securing a component in the printed circuit board.
Figure 3:
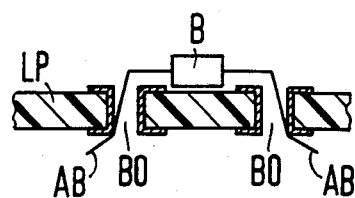
FIG. 3 is a partial cross-sectional view similar to FIG. 2 illustrating the component after the temporary securement.

The operation of the lower tool means U is schematically illustrated by FIGS. 2 and 3. According to FIG. 2, the connecting legs AB of the component B have been inserted into the bores BO of the printed circuit board LP. These legs AB can be further shortened to the desired length by means of the cutting device SE3 and SE4, which are controlled by the arithmetic unit R. The bending of the connection legs AB proceeds by means of a bending device controlled by the unit R which is illustrated in FIG. 2 only schematically by means of the arrows 6 and 7. In practice, the cutting devices SE3 and SE4 and the bending devices 6 and 7 can be designed, for example, in the form of integrated tools. After the bending of the connection legs AB as illustrated in FIG. 3, the position of the component B on the printed circuit board is temporarily secured in such a fashion that the component can no longer fall out.

This previously described assembly operation is repeated until the last component B is inserted in the printed circuit board LP in the desired position and the end of the assembly is, for example, displayed on the display screen BS. The operator then removes the completed, printed circuit board LP which after the complete assembly is to be designated a PC module and places it on a transport device T2 which can be, for example, a conveyor belt. The transport device T2 then forwards the PC module in the direction of the arrow 8, for example, for the purpose of soldering of the various leads extending through the board.

The identification device I2, which is illustrated in FIG. 1 and is designed in the form of a hand-held reading device, is likewise connected to the arithmetic unit R. It can be employed alone for the purpose of identification of the printed circuit board LP, which is to be provided with components or also employed for the purpose of identifying only in the case of failure of the stationary identification device I1. However, component containers can be identified with the identification device I2, which component containers are transported for the supply to the manual assembly station.

The keyboard unit TE, which is illustrated in FIG. 1, serves the purpose of input of control data, i.e., in addition to the consumption quantities recorded in the assembly program. Here, via keys, increased consumption or scrap, respectively, can be recorded. Fault messages and information regarding the supply of components B can also be detected.

The display screen BS of the arithmetic unit R can inform the operator, for example, regarding peculiarities of the component B. These peculiarities are related to the polarity of the component B to be inserted. They are related to comments regarding the endangering of the electrically required component B and the like.

Figure 4:
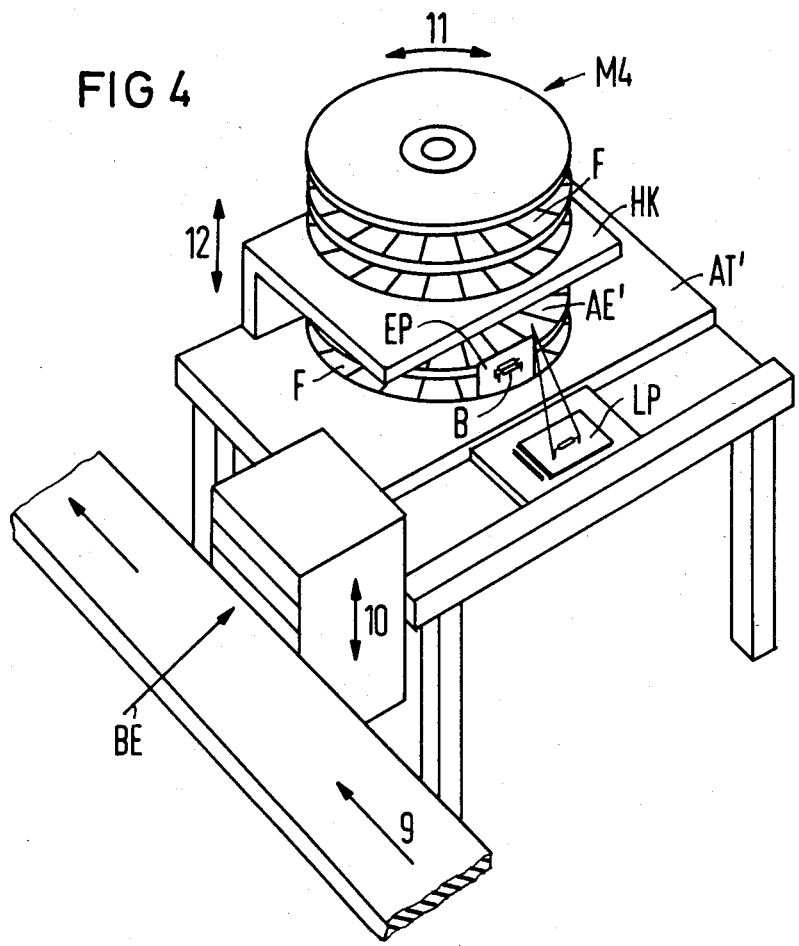
FIG. 4 is a schematic view of a second embodiment of a manual assembly station in accordance with the present invention.

An embodiment of the installation is illustrated in FIG. 4. In this embodiment, the printed circuit boards LP are supplied by a transport device T3 in the direction of the arrow 9 to a printed circuit board magazine LM which has several insertion planes. The printed circuit board LP, which is to be acted on is then loaded from the transport device T3 into the magazine LM by a loading and unloading device B which is only indicated by an arrow in FIG. 4. Thus, the printed circuit board on the transport T3 is inserted into one of the different storage planes of the magazine LM. The magazine LM provides a buffer effect in which a plurality of printed circuit boards can be arranged in a height-adjustable fashion and shifted as indicated in the vertical direction by the double arrow 10. The printed circuit boards LP, which are provided with the aid of the loading and unloading device BE are then slipped from the printed circuit board magazine LM and through an identification unit (not illustrated) in FIG. 4 onto a work table AT'. The operator then seizes the identified printed circuit board LP and places it in the receiver or holding means which is not illustrated in greater detail in FIG. 4. As illustrated, the installation has a single rotatable magazine M4 similar to the magazines M1 and M2 which can be rotated in a direction of the double arrow 11 and can be adjusted vertically in a direction of the double arrow 12. The magazine 4 possesses a single stationarily arranged removable position EP which can be utilized by each one of the compartments F. This removable position EP, which is an opening in a shield means, is so arranged that it can be particularly easily reached by the assembler. Since the arithmetic unit R automatically positions the desired compartment F at the removable position EP, the optical displays for the identification of the removable positions are not necessary. In the case of the embodiment of FIG. 4, moreover, the display device AE1 is mounted on a retaining console HK of the magazine M4 which provides a particularly space-saving arrangement on the work table AT1. At the end of the asembly operation, the completely assembled printed circuit board LP or PC module can then be removed and further transported via a transport device T3 for the purpose of soldering. The PC module can, however, also be inserted in an additional circuit board magazine arranged on the right side of the table AT' and can be further transported via a separate transport device for the purpose of transporting the completed modules to the soldering operation. For the remainder, the method of operating the assembly station, which is only partially illustrated in FIG. 4, corresponds to the operation of the manual equipping station illustrated in FIG. 1.

Although various minor modifications may be suggested by those versed in the art, it should be understood that we wish to embody within the scope of the patent granted hereon, all such modifications as reasonably and properly come within the scope of our contribution to the art.

We claim:

1. In an installation for the manual assembly of components on a printed circuit board comprising a table with holding means for non-mistakable positioning of the printed circuit board on which the components are to be assembled, a display means for optically identifying respective assembly positions of each component on the printed circuit board held by the holding means, at least one magazine for the purpose of making available components required for each assembly operation and arithmetic means for controlling the display means and a removable position for components in each of the magazines corresponding to the specific assembly program, the improvements comprising each magazine being designed for making available all components which are required for a spectrum of PC modules to be produced, the arithmetic means having access to all assembly programs for all of the PC modules of the spectrum of PC modules to be produced and identification means connected to the arithmetic means for identifying a printed circuit board being presented and for activating the associated assembly program for the particular identified printed circuit board.

2. In an installation according to claim 1, wherein the identification means is a stationarily arranged identification means.

3. In an installation according to claim 2, wherein the stationary identification means optically scans the identifications provided on the printed circuit boards, receives and interprets the reflected scanning rays and creates and supplies an identification signal to the arithmetic means.

4. In an installation device according to claim 2, which includes transport means for suppying printed circuit boards to the table, said transport means passing the printed circuit board through the identification means so that the type of the board being delivered is identified.

5. In an installation device according to claim 2, in which the installation includes a printed circuit board magazine arranged to discharge printed circuit boards to the installation through the identification means and which includes means for discharging selected printed circuit boards from the magazine to the installation.

6. In an installation according to claim 5, which includes transport means for supplying printed circuit boards to the printed circuit board magazine.

7. In an installation according to claim 6, wherein the means for unloading printed circuit boards from the magazine acts to load printed circuit boards from the transport means into the printed circuit magazine.

8. In an installation according to claim 1, wherein the identification means comprises a handheld reading device.

9. In an installation according to claim 1, wherein the identification means is stationarily positioned on the table for identifying printed circuit boards being supplied to the holding means, and which installation further includes a second identification means for identifying the printed circuit boards, said second identification means being a handheld reading device.

10. In an installation according to claim 1, which further includes a component preparation means controllable by the arithmetic means, said component preparation means including means for bending the connection legs of the component, at a desired spacing for being received in the printed circuit board at the assembly position.

11. In an installation according to claim 10, wherein the component preparation means includes means for cutting the connection legs to the desired length.

12. In an installation according to claim 1, which includes lower tool means for bending the connection legs of a component inserted in the printed circuit board to temporarily secure the component in its assembled position.

13. In an installation according to claim 12, wherein the lower tool means includes cutting devices for cutting sections of the connection legs to the desired length after the insertion of the component in the printed circuit board.

14. In an installation according to claim 1, wherein at least one of the magazines is designed in the form of a tower-shaped magazine provided with compartments arranged in sector formation in several planes and includes means for axially shifting the magazine and for rotating the magazine on its axis.

15. In an installation according to claim 14, wherein each of the compartments of the magazine are capable of being closed by a tab, said tabs being operated by their arithmetic means.

16. In an installation according to claim 14, which further includes at least one bar magazine in addition to the tower-shaped magazine.

17. In an installation according to claim 16, wherein each bar magazine and each of the compartments of the tower magazines are provided with optical displays, said optical displays being actuated by the arithmetic means when the component of the compartment and bar magazine is selected.

18. In an installation according to claim 14, wherein the tower-shaped magazine includes a stationarily-positioned shield member having an opening to enable access to a compartment aligned with said opening.

19. In an installation according to claim 1, wherein the arithmetic means includes a display screen.

20. In an installation according to claim 1, which includes a keyboard unit connected to the arithmetic means for input of additional control data.

* * * * *